United States Patent
Yu et al.

(10) Patent No.: US 11,114,627 B2
(45) Date of Patent: Sep. 7, 2021

(54) MANUFACTURING METHOD FOR FLEXIBLE DISPLAY PANEL AND FLEXIBLE DISPLAY PANEL COMPRISING CONCAVE TAPERED ORGANIC LAYER

(71) Applicant: Wuhan China Star Optoelectronics Semiconductor Display Technology Co., Ltd., Hubei (CN)

(72) Inventors: Lei Yu, Guangdong (CN); Songshan Li, Guangdong (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 682 days.

(21) Appl. No.: 15/780,023

(22) PCT Filed: Mar. 8, 2018

(86) PCT No.: PCT/CN2018/078473
§ 371 (c)(1),
(2) Date: May 30, 2018

(87) PCT Pub. No.: WO2019/144472
PCT Pub. Date: Aug. 1, 2019

(65) Prior Publication Data
US 2021/0083208 A1    Mar. 18, 2021

(30) Foreign Application Priority Data
Jan. 24, 2018 (CN) .......................... 201810069797.9

(51) Int. Cl.
*H01L 51/00* (2006.01)
*H01L 27/32* (2006.01)
*H01L 51/56* (2006.01)

(52) U.S. Cl.
CPC ...... *H01L 51/0097* (2013.01); *H01L 27/3276* (2013.01); *H01L 51/56* (2013.01); *H01L 2227/323* (2013.01); *H01L 2251/5338* (2013.01)

(58) Field of Classification Search
CPC . H01L 51/0097; H01L 51/56; H01L 27/3276; H01L 2251/5338; G06F 1/1652; G06F 1/1641
See application file for complete search history.

(56) References Cited

U.S. PATENT DOCUMENTS 10,921,857 B2 *  2/2021  Kim ..................... G06F 1/1652
2015/0263314 A1 *  9/2015  Sakuishi ............. H01L 51/5012
                                                          438/28
(Continued)

FOREIGN PATENT DOCUMENTS

CN    105845701 A    8/2016
CN    106601133 A    4/2017
(Continued)

OTHER PUBLICATIONS

Chinese Office Action issued in corresponding Chinese Application No. 201810069797.9, dated Apr. 14, 2020, pp. 1-15, The State Intellectual Property Office of People's Republic of China, Beijing, China.

Primary Examiner — Stephen M Bradley
Assistant Examiner — Gustavo G Ramallo
(74) Attorney, Agent, or Firm — Leong C. Lei

(57) ABSTRACT

The invention provides a manufacturing method for flexible display panel, comprising providing an array substrate, the array substrate comprising a semiconductor layer, dividing the flexible display panel into a pixel area and a bending area, adjacent to each other, the pixel area comprising the semiconductor layer; disposing a second groove in the bending area, and the second groove forming a step structure
(Continued)

in the array substrate, the step structure extending from inside of the array substrate towards direction opposite to inner wall of the second groove; filling the second groove with an organic material, and the organic material filling the second groove forming a concave tapered groove with flat surface of the array substrate; fabricating a source, a drain, and source/drain wiring on the array substrate, the source and the drain being connected to the semiconductor layer, the source/drain wiring covering the tapered groove.

8 Claims, 5 Drawing Sheets

(56) References Cited

U.S. PATENT DOCUMENTS

| | | |
|---|---|---|
| 2016/0260790 A1 | 9/2016 | Lee et al. |
| 2017/0092709 A1* | 3/2017 | Choi .................. H01L 51/5253 |
| 2018/0090698 A1* | 3/2018 | Jeong ................. H01L 27/3276 |
| 2019/0267440 A1* | 8/2019 | Park .................... G09G 3/3266 |
| 2020/0243574 A1* | 7/2020 | Tian ................... H01L 27/1262 |
| 2021/0028393 A1* | 1/2021 | Wang ................. H01L 51/0097 |

FOREIGN PATENT DOCUMENTS

| | | |
|---|---|---|
| CN | 106783917 A | 5/2017 |
| CN | 107086236 A | 8/2017 |
| CN | 107170758 A | 9/2017 |
| CN | 107204357 A | 9/2017 |
| CN | 107424519 A | 12/2017 |
| CN | 107546247 A | 1/2018 |
| JP | 2017192659 A | 10/2017 |

* cited by examiner

MANUFACTURING METHOD FOR FLEXIBLE DISPLAY PANEL AND FLEXIBLE DISPLAY PANEL COMPRISING CONCAVE TAPERED ORGANIC LAYER

CROSS REFERENCE TO RELATED APPLICATIONS

This application is a National Phase of International Application Number PCT/CN2018/078473, filed Mar. 8, 2018, and claims the priority of Chinese Patent Application No. CN201810069797.9, entitled "MANUFACTURING METHOD FOR FLEXIBLE DISPLAY PANEL AND FLEXIBLE DISPLAY PANEL", filed on Jan. 24, 2018, the disclosure of which is incorporated herein by reference in its entirety.

BACKGROUND OF THE INVENTION

1. Field of the Invention

The present invention relates to the field of display and, in particular, to the field of manufacturing method for flexible display panel and flexible display panel.

2. The Related Arts

In the conventional manufacturing process for the flexible organic light-emitting diode (OLED) display panel, to enhance the bending performance of the display panel, a plurality of holes are opened in the inorganic layer in the layer structure in the OLED and filled with organic materials to improve the bending performance of the OLED display panel because the bending performance of organic materials is significantly better than inorganic materials.

However, when filling with organic materials, since the opened holes are deep, the organic material cannot be filled into deep holes, a tapered groove will be formed on the outer surface, and the depth of the tapered groove is too deep and the slope is too steep. When manufacturing the source/drain wiring, the wiring bends too much in the taper groove, which may break the wiring.

SUMMARY OF THE INVENTION

The primary object of the present invention is to provide a manufacturing method for flexible display panel, able to reduce the bending extent of the source/drain wiring at the tapered groove to effectively improve the breakage problem of the source/drain wiring at the tapered groove.

To solve the above technical issue, the present invention provides the following technical solutions:

In a first embodiment, the present invention provides a manufacturing method for flexible display panel, which comprises the following steps:

providing an array substrate, the array substrate comprising a semiconductor layer, dividing the flexible display panel into a pixel area and a bending area, adjacent to each other, the pixel area comprising the semiconductor layer;

disposing a second groove in the bending area, and the second groove forming a step structure in the array substrate, the step structure extending from inside of the array substrate towards direction opposite to inner wall of the second groove;

filling the second groove with an organic material, and the organic material filling the second groove forming a concave tapered groove with flat surface of the array substrate;

fabricating a source, a drain, and source/drain wiring on the array substrate, the source and the drain being connected to the semiconductor layer, the source/drain wiring covering the tapered groove.

In a first preferred embodiment of the present invention, the manufacturing method further comprises: disposing a first groove in the pixel area; patterns of the first groove and the second groove being formed by same mask, and then filling the first groove with an organic material.

In a second preferred embodiment of the present invention, the mask comprises: a first transmissive area and a second transmissive area, the first transmissive area corresponding to position of the first groove, and the second transmissive area corresponds to position of the second groove; the first transmissive area having a first transmittance rate with respect to light, the second transmissive area comprising a central area and a first edge area, the central area having a second transmittance rate with respect to light, and the first edge area having a third transmittance rate with respect to light; the second transmittance rate being greater than the third transmittance rate, and the steps of disposing the first groove and the second groove comprising:

exposing the pixel area and the bending area through the mask;

developing the exposed pixel area and the exposed bending area to obtain a pattern of the first groove and a pattern of the second groove;

etching the pattern of the first groove and the pattern of the second groove to obtain the first groove and the second groove, and the second groove forming the step structure in the array substrate.

In a third preferred embodiment of the present invention, the first transmittance rate is 30-60%, and the second transmittance rate is 90-100%.

In a fourth preferred embodiment of the present invention, when etching the first groove and the second groove, the first groove and the second groove are controlled to be tapered inwardly from surface of the array substrate.

In a fifth preferred embodiment of the present invention, a second edge area is disposed in the second transmissive area of the mask, and the second edge area and the first edge area are disposed on two opposite sides of the central area so that the step structure of the second groove forms a first step structure and a second step structure opposingly.

In a sixth preferred embodiment of the present invention, the array substrate comprises: a substrate layer, a barrier layer, a buffer layer, the semiconductor layer, a first gate insulating layer, the first gate layer, a second gate insulating layer, the second gate layer, and a dielectric layer, all sequentially stacked; the first groove penetrates the dielectric layer, the second gate insulating layer and the first gate insulating layer, and the second groove penetrates the dielectric layer, the second gate insulating layer, the first gate insulating layer, the buffer layer, and the barrier layer, the step structure is disposed in the buffer layer.

In a seventh preferred embodiment of the present invention, the manufacturing method further comprises:

laminating a planarization layer on the dielectric layer, the planarization layer covering the source, the drain, and the source/drain wiring; fabricating an anode on the planarization layer, connecting the anode to the drain, stacking a pixel definition layer on the planarization layer, the pixel definition layer covering the anode, fabricating an OLED light-emitting layer on the pixel definition layer and connecting the OLED light-emitting layer to the anode.

In an eighth preferred embodiment of the present invention, the substrate layer, the planarization layer and the pixel definition layer are made of organic material; the barrier layer, the buffer layer, the first gate insulating layer, the second gate insulating layer, and the dielectric layer are made of inorganic material.

A second embodiment of the present invention provides a flexible display panel, which comprises; an array substrate, the array substrate comprising a semiconductor layer, the flexible display panel comprising a pixel area and a bending area, adjacent to each other, the pixel area comprising the semiconductor layer, and the bending area being disposed a second groove; the second groove forming a step structure in the array substrate; the step structure extending from inside of the array substrate towards direction opposite to inner wall of the second groove; the second groove being filled with an organic material; the organic material filling the second groove forming a concave tapered groove with flat surface of the array substrate, and the array substrate further comprising a source, a drain, and source/drain wiring; the source and the drain being connected to the semiconductor layer, and the source/drain wiring covering the tapered groove.

The present invention provides the following advantages;

In the manufacturing method for flexible display panel provided by the present invention, a step structure is formed in the array substrate by excavating a second groove, so that the organic material filling in the second groove can fill to a deeper position to fill the second groove more, so that the tapered groove can be made shallower with gentler slope. This can reduce the bending extent of the source/drain wiring at the tapered groove, thereby effectively improve the breakage problem of the source/drain wiring in the tapered groove.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

DETAILED DESCRIPTION OF THE PREFERRED EMBODIMENTS

To further explain the technical means and effect of the present invention, the following refers to embodiments and drawings for detailed description. Apparently, the described embodiments are merely some embodiments of the present invention, instead of all embodiments. All other embodiments based on embodiments in the present invention and obtained by those skilled in the art without departing from the creative work of the present invention are within the scope of the present invention.

The terms "comprising" and "having" and any variations thereof appearing in the specification, claims, and drawings of the present application are intended to cover non-exclusive inclusion. For example, a process, method, system, product, or device that includes a series of steps or units is not limited to the listed steps or units, but optionally also includes steps or units not listed, or alternatively, other steps or units inherent to these processes, methods, products or equipment. In addition, the terms "first", "second" and "third" are used to distinguish different objects and not intended to describe a particular order.

Figure 1:
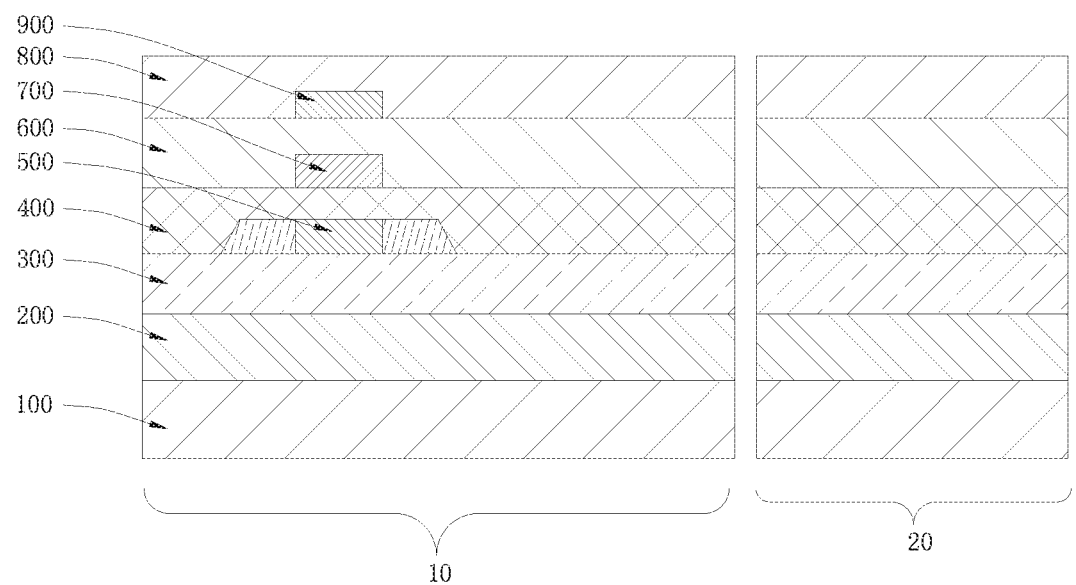
FIG. 1 is a schematic view showing the structure of the first step of the manufacturing method for flexible display panel according to an exemplary embodiment of the present invention.

As shown in FIG. 1, FIG. 1 is a schematic view showing the structure of the first step of the manufacturing method for flexible display panel according to an exemplary embodiment of the present invention. In the manufacturing method for flexible display panel, the first step is:

providing an array substrate, the array substrate comprising a semiconductor layer 500, dividing the flexible display panel into a pixel area 10 and a bending area 20, adjacent to each other, the pixel area 10 comprising the semiconductor layer 500. Moreover, the array substrate comprises: a substrate layer 100, a barrier layer 200, a buffer layer 300, the semiconductor layer 500, a first gate insulating layer 400, a first gate layer 700, a second gate insulating layer 600, a second gate layer 900, and a dielectric layer 800, all sequentially stacked.

Figure 2:
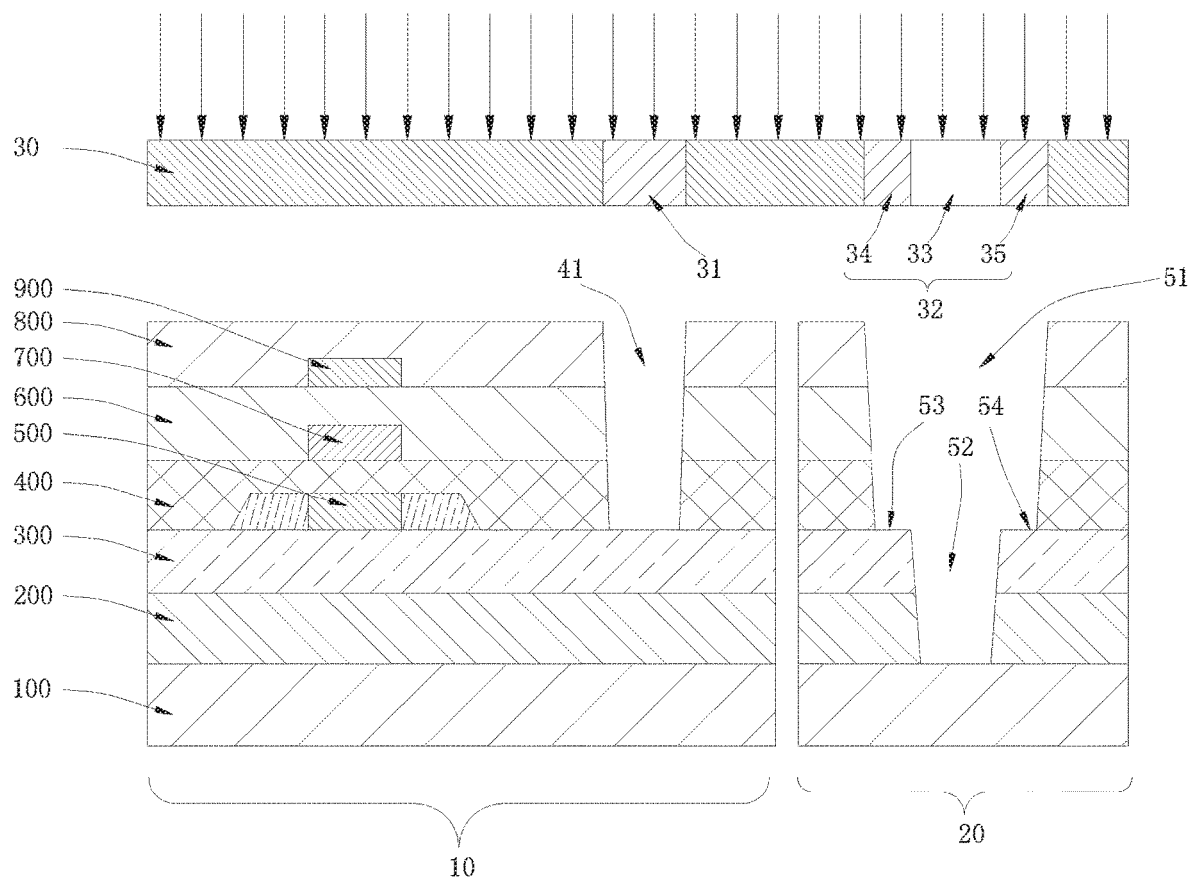
FIG. 2 is a schematic view showing the structure of the second step of the manufacturing method for flexible display panel according to an exemplary embodiment of the present invention.

Refer to FIG. 2. FIG. 2 is a schematic view showing the structure of the second step of the manufacturing method for flexible display panel according to an exemplary embodiment of the present invention. In the manufacturing method for flexible display panel, the second step is:

disposing a second groove 51 in the bending area 20, and the second groove 51 forming a step structure 53 in the array substrate, the step structure 53 extending from inside of the array substrate towards direction opposite to inner wall of the second groove 51. Moreover, the manufacturing method further comprises: disposing a first groove 41 in the pixel area 10, patterns of the first groove 41 and the second groove 51 being formed by same mask 31. The excavating of the first groove 41 and the second groove 51 can be performed simultaneously or sequentially. Moreover, the first groove 41 penetrates the dielectric layer 800, the second gate insulating layer 600 and the first gate insulating layer 400, and the second groove 51 penetrates the dielectric layer 800, the second gate insulating layer 600, the first gate insulating layer 400, the buffer layer 300, and the barrier layer 200, the step structure 53 is disposed in the buffer layer 300.

Figure 3:
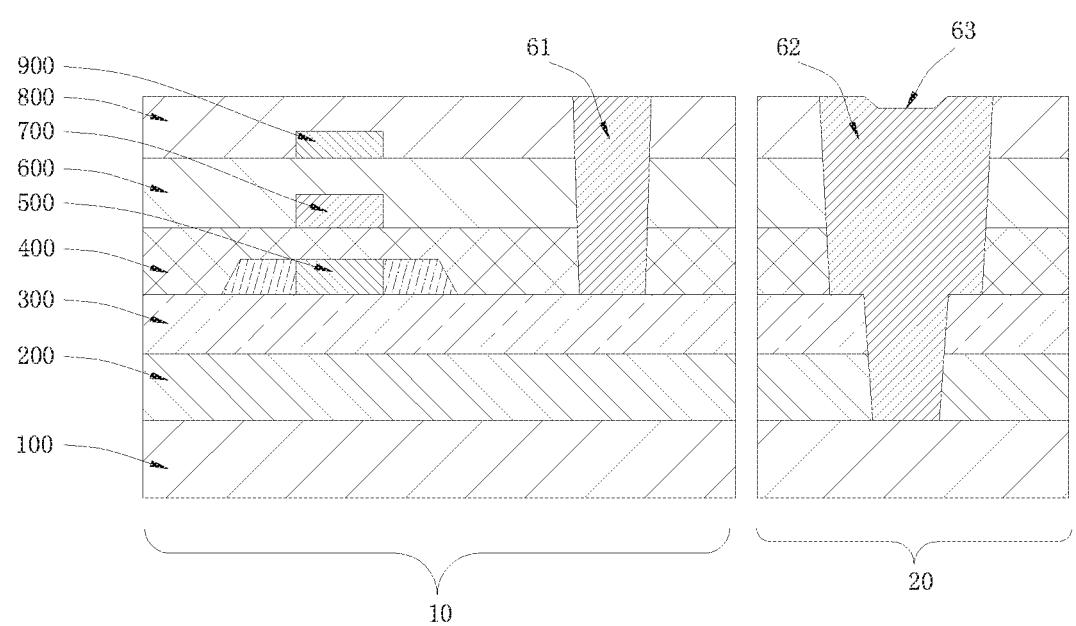
FIG. 3 is a schematic view showing the structure of the third step of the manufacturing method for flexible display panel according to an exemplary embodiment of the present invention.

Refer to FIG. 3. FIG. 3 is a schematic view showing the structure of the third step of the manufacturing method for flexible display panel according to an exemplary embodiment of the present invention. In the manufacturing method for flexible display panel, the third step is:

filling the second groove 51 with an organic material 62, and the organic material 62 filling the second groove 51 forming a concave tapered groove 63 with flat surface of the array substrate. Specifically, the organic material 62 form a tapered groove 63 concave towards the inside of the dielectric layer 800 with flat surface of the dielectric layer 800. The opening direction of the tapered groove 63 is the same as the opening direction of the second groove 51, and bot are away from the substrate layer 100. The present embodiment also comprises a step of filling the first groove 41 with the organic material 61.

Figure 4:
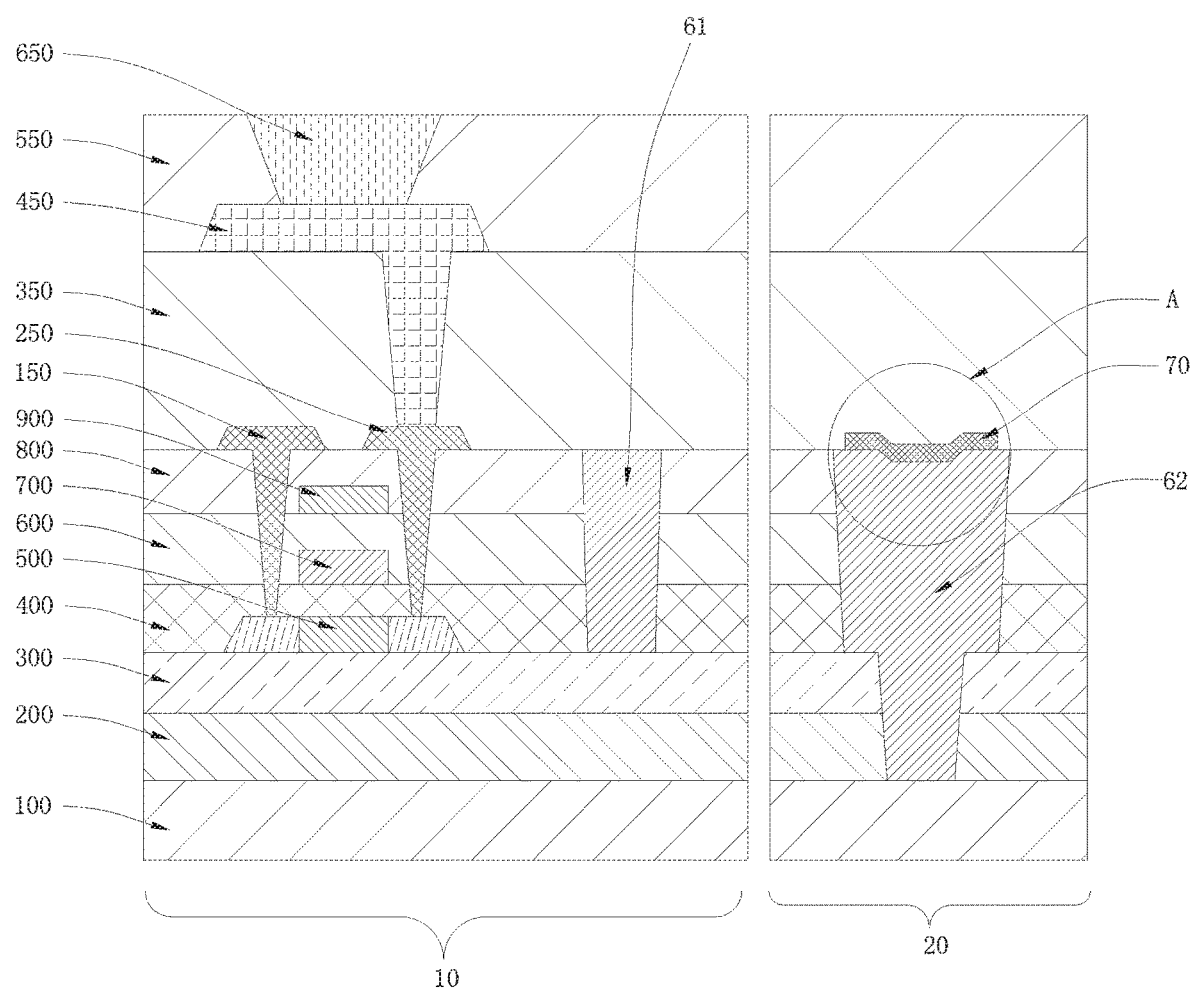
FIG. 4 is a schematic view showing the structure of the fourth step of the manufacturing method for flexible display panel according to an exemplary embodiment of the present invention.

Refer to FIG. 4. FIG. 4 is a schematic view showing the structure of the fourth step of the manufacturing method for flexible display panel according to an exemplary embodiment of the present invention. In the manufacturing method for flexible display panel, the fourth step is:

fabricating a source 150, a drain 250, and source/drain wiring 70 on the array substrate, the source 150 and the drain 250 being connected to the semiconductor layer 500, the source/drain wiring 70 covering the tapered groove 63. Moreover, the source 150, the drain 250, and the source/drain wiring 70 are fabricated on the dielectric layer 800. A planarization layer 350 is stacked on the dielectric layer 800, and an anode 450 is fabricated on the planarization layer 350. The anode 450 is connected to the drain 250. A pixel definition layer 550 is stacked on the planarization layer 350 and the pixel definition layer 550 covers the anode 450. An OLEO light-emitting layer 650 is fabricated on the pixel definition layer 550 and is connected to the anode 450.

As such, a step structure is formed in the array substrate by excavating a second groove 51, so that the organic material filling 62 in the second groove 51 can fill to a deeper position to fill the second groove 51 more, so that the tapered groove 63 can be made shallower with gentler slope. This can reduce the bending extent of the source/drain wiring 70 at the tapered groove, thereby effectively improve the breakage problem of the source/drain wiring 70 in the tapered groove 63.

In the present embodiment, the barrier layer 200, the buffer layer 300, the first gate insulating layer 400, the second gate insulating layer 600, and the dielectric layer 800 are made of inorganic material. Specifically, the substrate layer 100 is flexible. The material of the substrate layer 100 is an organic material, preferably polyimide. The process of stacking the barrier layer 200 and the buffer layer 300 on the substrate layer 100 can be a deposition method. The material for the barrier layer 200 may be SiOx, and the material for the buffer layer 300 may be SiNx+SiOx. The process of fabricating the semiconductor layer 500 may be an exposing, developing and etching process to obtain a patterned semiconductor layer 500. The material of the semiconductor layer 500 may be poly-silicon (Poly-Si). The first gate insulating layer 400 is used to insulate the first gate layer 700 from the semiconductor layer 500. The fabrication process of the first gate insulating layer 400 is a deposition method. The fabrication process of the first gate layer 700 may be an exposure, development and etching process to obtain a patterned first gate layer 700. The material for the first gate layer 700 may be molybdenum (Mo). The method for fabricating the second gate insulating layer 600 may be the same as the method for fabricating the first gate insulating layer 400, that is, a deposition method is used. The method for fabricating the second gate layer 900 may be the same as the method for fabricating the first gate layer 700. That is, an exposure, development and etching process is used to obtain a patterned second gate layer 900. The material for the second gate layer 900 may be Molybdenum (Mo). The method for fabricating the dielectric layer 800 can also be a deposition method. The material for the dielectric layer 800 can be SiNx+SiOx, Annealing hydrogenation and activation are performed after the dielectric layer 800 is fabricated to facilitate the subsequent process.

In the present embodiment, the process of fabricating the source 150 and the drain 250 may be performed first by forming a via to connect the dielectric layer 800 to the semiconductor layer 500, and then depositing a metal layer on the dielectric layer 800. The material for the metal layer may be titanium/aluminum/titanium. (Ti/Al/Ti), the metal of the metal layer fills the via, and then the metal layer is patterned using an exposure, development and etching process to obtain a pattern of the source 150 and the drain 250. Fabricating the source/drain wiring 70 can be accomplished by depositing the same metal layer as the source 150 and drain 250, and patterning through an exposure, development and etching process. The source/drain wiring 70 are used to connect to a driver IC outside the flexible display panel. In the present embodiment, the source/drain wiring is not disposed at the organic material 61 filling the first groove 41. Therefore, there is no need to handle the breakage problem of the source/drain wiring at the first groove 41. The process of fabricating the planarization layer 350 may be a deposition process. The material for the planarization layer 350 and the pixel definition layer 550 is an organic material, preferably polyimide, to provide good flexibility. The anode 450 may be fabricated by fabricating a via on the planarization layer 350 and connecting to the drain 250 and then depositing a metal layer. The material for the metal layer may be indium tin oxide/silver/indium tin oxide (ITO/Ag/ITO). The metal layer fills the via, and then the metal layer is patterned by an exposure, development and etching process to obtain a pattern of the anode 450. The fabrication of the pixel definition layer 550 may also be deposition. The OLED light-emitting layer 650 is fabricated by an evaporation process, and the vapor formed by the OLED organic light-emitting material is deposited through the mask into the via on the pixel definition layer 550 connected to the anode.

In an embodiment, the tapered groove 63 and the step structure 53 have a partially overlapping projection on the substrate layer 100. Preferably, the tapered groove 63 and the step structure 53 have a ratio of ⅓-½ projection ratio. With the overlapping projection of the tapered groove 63 and the step structure 53 on the substrate layer 100, when the organic material can be made to flow in and fill the second groove 51, the position of the tapered groove 63 is directly above the position between the step structure 53 and a deeper groove 52 in the second groove 51. Since the step structure 53 can be filled deeper, the organic material is less likely to collapse at the deeper groove 52, so that the depth of the tapered groove 63 is shallower and the slope is gentler.

In an embodiment, referring to FIG. 2, the excavating the first groove 41 and the second groove 51 comprises:

providing a mask 30, the mask 30 comprising: a first transmissive area 31 and a second transmissive area 32, the first transmissive area 31 corresponding to position of the first groove 42, and the second transmissive area 32 corresponds to position of the second groove 51; the first transmissive area 31 having a first transmittance rate with respect to light, the second transmissive area 32 comprising a central area 33 and a first edge area 34, the central area 33 having a second transmittance rate with respect to light, and the first edge area 34 having a third transmittance rate with respect to light, the second transmittance rate being greater than the third transmittance rate; performing exposure on the pixel area 10 and the bending area 20 through the mask 30;

developing the exposed pixel area 10 and the exposed bending area 20 to obtain a pattern of the first groove 41 and a pattern of the second groove 51;

etching the pattern of the first groove 41 and the pattern of the second groove 51 to obtain the first groove 41 and the second groove 51, and the second groove 51 forming the step structure 53 in the array substrate.

In the present embodiment, because the mask 30 comprising a first transmissive area 31 and a second transmissive area 32, and the first transmissive area 31 and the second transmissive area 32 having different transmittance rates with respect to light, patterns with different depth and shape can be manufactured. Therefore, using a mask 30 is sufficient to manufacture the patterns of the first groove 41 and the second groove 51 in one process. Compared to known technique using multiple masks in multiple processes, the present invention simplifies the process and saves cost.

In an embodiment, the first transmittance rate is 30-60%, and the second transmittance rate is 90-100%. Moreover, the first transmittance rate is 40-50%, and the second transmittance rate is 95-100%. Preferably, the first transmittance rate is 50%, and the second transmittance rate is 100%. The higher the transmittance rate is, the more the light penetrates through the mask 30, and the deeper the depth of the pattern produced by the light. In the present embodiment, the transmittance rate of the central area 33 is the highest, and the depth of the pattern produced by the light transmitted through the central area 33 penetrates through the dielectric layer 800, the second gate insulating layer 600, the first gate insulating layer 400, the buffer layer 300, and the barrier layer 200; the light transmitted through the first transmissive area 31 and the first edge area 34 is less than the central area 34 so that the depth of the pattern formed by the light transmitted through the first transmissive area 31 and the first edge area 34 is shallower than the depth of the pattern produced by the central area 34. The deeper pattern produced by the central area 34 is as marked 52 shown in FIG. 2; so that the second groove 52 can form the step structure 53.

Moreover, the third transmittance rate and the first transmittance rate are the same. As such, the depth of the pattern made by the first transmissive area 31 and the depth of the pattern made by the first edge area 34 of the second transmissive area 32 can be the same. In the present embodiment, the depth of the patterns made by the first transmissive area 31 and the first edge area 34 of the second transmissive area 32 penetrates through the dielectric layer 800, the second gate insulation layer 600, and the first gate insulation layer 400.

Moreover, a second edge area 35 is disposed in the second transmissive area 32 of the mask 30, and the second edge area 35 and the first edge area 34 are disposed on two opposite sides of the central area 33 so that the step structure of the second groove 51 forms a first step structure 53 and a second step structure 54 opposingly.

Moreover, the size of the second edge area 35 is the same as the size of the first edge area 34. That is, the second edge area 35 and the first edge area 34 are symmetrically disposed on both sides of the central area 33, so that the formed first step structure 53 and the second step structure 54 have the same size so that the shape and structure of the tapered groove 63 formed by the subsequent filling of the organic material 62 are also symmetrical, which is favorable for the source/drain wiring 70.

In an embodiment, when etching the first groove 41 and the second groove 51, the first groove 41 and the second groove 51 are controlled to be tapered inwardly from surface of the array substrate. Moreover, When etching the first groove 41, the shape of the first groove 41 is controlled to be gradually reduced in size from the dielectric layer 800 to the first gate insulating layer 400, and when etching the second groove 51, the shape of the second groove 51 is controlled to be gradually reduced in size from the buffer layer 300 to the barrier layer 200. The dielectric layer 800 is gradually reduced in size toward the first gate insulating layer 400, and the size of the second groove 51 located at the bottom of the first gate insulating layer 400 is larger than the size at the top of the buffer layer 300 to form the step structure 53. Through the above disposition, the first groove 41 is in the shape of an inverted trapezoid, and the second groove 51 is in the form of two inverted trapezoidal superimposed shapes, which facilitates the retracting of the etching knife and also facilitates the organic material filling the first groove 41 and the second groove 51.

Figure 5:
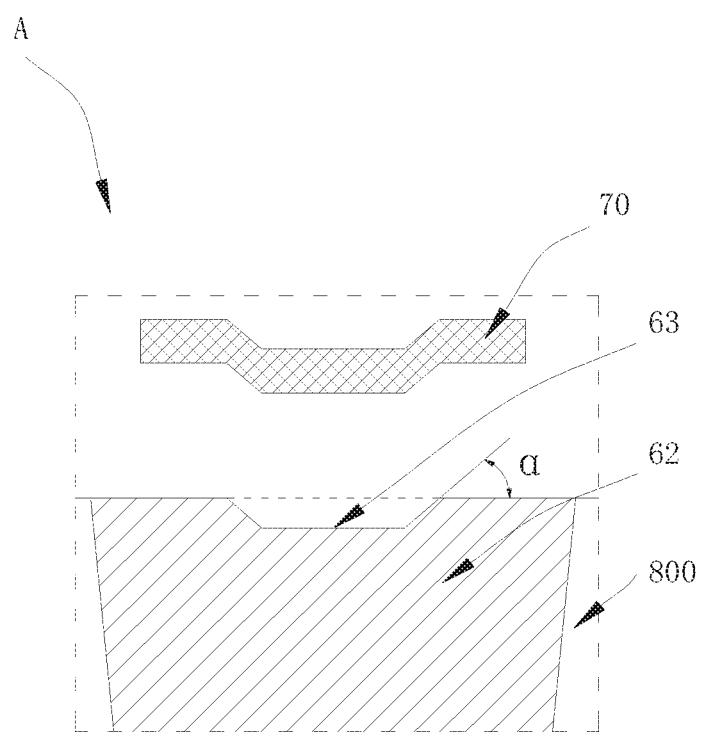
FIG. 5 is a partial enlarged view showing circle A in FIG. 4.

In an embodiment, referring to FIG. 5, FIG. 5 is a partial enlarged view showing circle A in FIG. 4. The source/drain wiring 70 is separated from the organic material 62 in the figure. The angle α formed by the slope of the tapered groove 63 formed by the organic material 62 filling in the second groove 51 and the plane of extension of the dielectric layer 800 is 0-45°. Due to the provision of the step structure 53, the organic material 62 can be filled in a deeper position, and the tapered groove 63 formed on the surface of the organic material can be shallower and have a gentler slope. In the present embodiment, the tapered groove 63 comprises a bottom and a slope, the slope is connected between the bottom and outer surface of the organic material 62, and the outer surface of the organic material 62 is leveled with the surface of the dielectric layer 800. Furthermore, an angle α between the slope of the tapered groove 63 and the extending plane of the dielectric layer 800 is 5-35°, moreover, angle α between the slope of the tapered groove 63 and the extending plane of the dielectric layer 800 is 15-30°

Refer to FIG. 4. The present invention also provides a flexible display panel, which comprises: an array substrate, the array substrate comprising a semiconductor layer 500, the flexible display panel comprising a pixel area 10 and a bending area 20, adjacent to each other, the pixel area 10 comprising the semiconductor layer 500, and the bending area 20 being disposed a second groove (marked 51 in FIG. 2); the second groove 51 forming a step structure 53 in the array substrate; the step structure 53 extending from inside of the array substrate towards direction opposite to inner wall of the second groove 51; the second groove 51 being filled with an organic material 62; the organic material 62 filling the second groove 51 forming a concave tapered groove (marked 63 in FIG. 3) with flat surface of the array substrate, and the array substrate further comprising a source 150, a drain 250, and source/drain wiring 70; the source 150 and the drain 250 being connected to the semiconductor layer 500, and the source/drain wiring 70 covering the tapered groove 63.

The flexible display panel of the present embodiment is provided with a second groove 51 having a step structure 53 and filled with an organic material 62 in the second groove 51, because the organic material has better flexibility performance than the inorganic material, so that the flexible display panel in the present embodiment is more flexible. At the same time, the organic material 62 can be filled to a deeper position in the second groove 51, and the second groove 51 can be filled more completely, so that the depth of the tapered groove 63 formed by the outer surface of the organic material 62 is shallower and the slope is gentler, which can reduce the bending extent of the source/drain wiring 70 at the tapered groove 63, which is beneficial to improve the breakage problem of the source/drain wiring 70 at the tapered groove 63.

It should be noted that each of the embodiments in this specification is described in a progressive manner, each of which is primarily described in connection with other embodiments with emphasis on the difference parts, and the same or similar parts may be seen from each other. For the device embodiment, since it is substantially similar to the method embodiment, the description is relatively simple and the relevant description may be described in part of the method embodiment.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method for flexible display panel, comprising:
    providing an array substrate, the array substrate comprising a semiconductor layer, dividing the flexible display panel into a pixel area and a bending area, adjacent to each other, the pixel area comprising the semiconductor layer;
    disposing a second groove in the bending area, and the second groove forming a step structure in the array substrate, the step structure extending from inside of the array substrate towards direction opposite to inner wall of the second groove;
    filling the second groove with an organic material, and the organic material filling the second groove forming a concave tapered groove with flat surface of the array substrate;
    fabricating a source, a drain, and source/drain wiring on the array substrate, the source and the drain being connected to the semiconductor layer, the source/drain wiring covering the tapered groove; and
    disposing a first groove in the pixel area, patterns of the first groove and the second groove being formed by same mask, and then filling the first groove with an organic material.

2. The manufacturing method for flexible display panel as claimed in claim 1, wherein the mask comprises: a first transmissive area and a second transmissive area, the first transmissive area corresponding to position of the first groove, and the second transmissive area corresponds to position of the second groove; the first transmissive area having a first transmittance rate with respect to light, the second transmissive area comprising a central area and a first edge area, the central area having a second transmittance rate with respect to light, and the first edge area having a third transmittance rate with respect to light; the second transmittance rate being greater than the third transmittance rate, and the steps of disposing the first groove and the second groove comprising:
    exposing the pixel area and the bending area through the mask;
    developing the exposed pixel area and the exposed bending area to obtain a pattern of the first groove and a pattern of the second groove;
    etching the pattern of the first groove and the pattern of the second groove to obtain the first groove and the second groove, and the second groove forming the step structure in the array substrate.

3. The manufacturing method for flexible display panel as claimed in claim 2, wherein the first transmittance rate is 30-60%, and the second transmittance rate is 90-100%.

4. The manufacturing method for flexible display panel as claimed in claim 2, wherein when etching the first groove and the second groove, the first groove and the second groove are controlled to be tapered inwardly from surface of the array substrate.

5. The manufacturing method for flexible display panel as claimed in claim 2, wherein a second edge area is disposed in the second transmissive area of the mask, and the second edge area and the first edge area are disposed on two opposite sides of the central area so that the step structure of the second groove forms a first step structure and a second step structure opposingly.

6. The manufacturing method for flexible display panel as claimed in claim 1, wherein the array substrate comprises: a substrate layer, a barrier layer, a buffer layer, the semiconductor layer, a first gate insulating layer, the first gate layer, a second gate insulating layer, the second gate layer, and a dielectric layer, all sequentially stacked; a first groove penetrates the dielectric layer, the second gate insulating layer and the first gate insulating layer, and the second groove penetrates the dielectric layer, the second gate insulating layer, the first gate insulating layer, the buffer layer, and the barrier layer, the step structure is disposed in the buffer layer.

7. The manufacturing method for flexible display panel as claimed in claim 6, further comprising:
    laminating a planarization layer on the dielectric layer, the planarization layer covering the source, the drain, and the source/drain wiring; fabricating an anode on the planarization layer, connecting the anode to the drain, stacking a pixel definition layer on the planarization layer, the pixel definition layer covering the anode, fabricating an OLED light-emitting layer on the pixel definition layer and connecting the OLED light-emitting layer to the anode.

8. The manufacturing method for flexible display panel as claimed in claim 7, wherein the substrate layer, the planarization layer and the pixel definition layer are made of organic material; the barrier layer, the buffer layer, the first gate insulating layer, the second gate insulating layer, and the dielectric layer are made of inorganic material.

* * * * *